(12) United States Patent
Zheng et al.

(10) Patent No.: US 11,762,042 B2
(45) Date of Patent: Sep. 19, 2023

(54) MAGNETIC FIELD SENSOR AND METHODS OF FABRICATING A MAGNETIC FIELD SENSOR

(71) Applicant: GLOBALFOUNDRIES Singapore Pte. Ltd., Singapore (SG)

(72) Inventors: Ping Zheng, Singapore (SG); Eng Huat Toh, Singapore (SG); Yongshun Sun, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 329 days.

(21) Appl. No.: 17/105,675

(22) Filed: Nov. 27, 2020

(65) Prior Publication Data

US 2022/0171001 A1    Jun. 2, 2022

(51) Int. Cl.
| | | |
|---|---|---|
| *H10N 52/00* | (2023.01) | |
| *G01R 33/07* | (2006.01) | |
| *H10N 50/85* | (2023.01) | |
| *H10N 52/01* | (2023.01) | |

(52) U.S. Cl.
CPC ........... *G01R 33/077* (2013.01); *H10N 50/85* (2023.02); *H10N 52/01* (2023.02); *H10N 52/101* (2023.02)

(58) Field of Classification Search
CPC .............................. H01L 27/22; H01L 43/065
See application file for complete search history.

(56) References Cited

U.S. PATENT DOCUMENTS

| | | | |
|---|---|---|---|
| 8,026,718 B2 | 9/2011 | Miyoshi et al. | |
| 10,586,915 B2 | 3/2020 | Ausserlechner | |
| 2020/0371169 A1* | 11/2020 | Bramanti | ................ H01L 43/14 |
| 2021/0242326 A1* | 8/2021 | Shima-Edelstein | ......................... H01L 21/823462 |

(Continued)

OTHER PUBLICATIONS

Heidari et al., "Sensitivity Characteristics of Horizontal and Vertical Hall Sensors in the Voltage- and Current-Mode", 2015 11th Conference on Ph.D. Research in Microelectronics and Electronics (PRIME), 2015, pp. 330-333, IEEE.

(Continued)

*Primary Examiner* — Moazzam Hossain
*Assistant Examiner* — Hajar Kolahdouzan
(74) *Attorney, Agent, or Firm* — VIERING, JENTSCHURA & PARTNER MBB

(57) ABSTRACT

A magnetic field sensor may include a semiconductor structure having a planar surface, and first, second, and third sensing devices. The semiconductor structure may include a semiconductor member having a two-dimensional electron gas therein, and an insulator member disposed on the semiconductor member. The first sensing device may be configured to sense magnetic field along a first axis parallel to the planar surface. The second sensing device may be configured to sense magnetic field along a second axis parallel to the planar surface, and orthogonal to the first axis. The third sensing device may be configured to sense a magnetic field along a third axis normal to the planar surface. Each of the first, second, and third sensing devices may be formed in the semiconductor structure and may include electrodes that extend from the insulator member to the two-dimensional electron gas.

20 Claims, 9 Drawing Sheets

(56) References Cited

OTHER PUBLICATIONS

Alpert et al., "Sensitivity of 2DEG-based Hall-effect sensors at high temperatures", Review of Scientific Instruments, 2020, 7 pages, vol. 91, AIP Publishing.

Kaufmann et al., "Novel Coupling Concept for Five-Contact Vertical Hall Devices", 2011 16th International Solid-State Sensors, Actuators and Microsystems Conference, 2011, pp. 2855-2858, IEEE.

Xu et al., "A Highly Sensitive CMOS Digital Hall Sensor for Low Magnetic Field Applications", Sensors, 2012, pp. 2162-2174, MDPI.

* cited by examiner

MAGNETIC FIELD SENSOR AND METHODS OF FABRICATING A MAGNETIC FIELD SENSOR

TECHNICAL FIELD

Various embodiments relate to magnetic field sensors and methods of fabricating a magnetic field sensor.

BACKGROUND

Magnetic field sensors are widely used in various applications, including inertial measurement units, power electronics, automotive and aviation. One type of magnetic field sensor is the Hall-effect sensor. A Hall-effect sensor produces an output signal proportional to the magnetic field that it is measuring. Hall-effect sensors are typically made of silicon due to low cost, ease of manufacturing and compatibility with integrated circuits. However, silicon-based components begin to break down at temperatures beyond 200° C. Moreover, silicon-based Hall-effect sensors suffer from low electron mobility and a large offset error. The output signal that a Hall-effect sensor produces in the absence of magnetic field is known as the offset error. A large offset error diminishes the sensitivity of the Hall-effect sensor, and renders it unsuitable to work in a low magnetic field environment.

SUMMARY

According to various embodiments, a magnetic field sensor may include a semiconductor structure having a planar surface. The semiconductor structure may include a semiconductor member having a two-dimensional electron gas (2DEG) therein, and may further include an insulator member disposed on the semiconductor member. The magnetic field sensor may further include a first sensing device, a second sensing device and a third sensing device formed in the semiconductor structure. The first sensing device may include a first plurality of electrodes. The first sensing device may be configured to sense magnetic field along a first axis parallel to the planar surface. The second sensing device may include a second plurality of electrodes. The second sensing device may be configured to sense magnetic field along a second axis. The second axis may be parallel to the planar surface and may be orthogonal to the first axis. The third sensing device may include a third plurality of electrodes. The third sensing device may be configured to sense magnetic field along a third axis normal to the planar surface. All electrodes of the first plurality of electrodes, the second plurality of electrodes and the third plurality of electrodes may extend from the insulator member to the 2DEG.

According to various embodiments, a method of fabricating a magnetic field sensor may include forming a semiconductor structure. The semiconductor structure may have a planar surface, and may include a semiconductor member and an insulator member disposed on the semiconductor member. The semiconductor member may have a 2DEG. The method may further include forming a first sensing device, a second sensing device and a third sensing device in the semiconductor structure. The first sensing device may include a first plurality of electrodes. The second sensing device may include a second plurality of electrodes. The third sensing device may include a third plurality of electrodes. The first sensing device may be configured to sense magnetic field along a first axis parallel to the planar surface. The second sensing device may be configured to sense magnetic field along a second axis. The second axis may be parallel to the planar surface and may be orthogonal to the first axis. The third sensing device may be configured to sense magnetic field along a third axis normal to the planar surface. All electrodes of the first plurality of electrodes, the second plurality of electrodes and the third plurality of electrodes may extend from the insulator member to the 2DEG.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
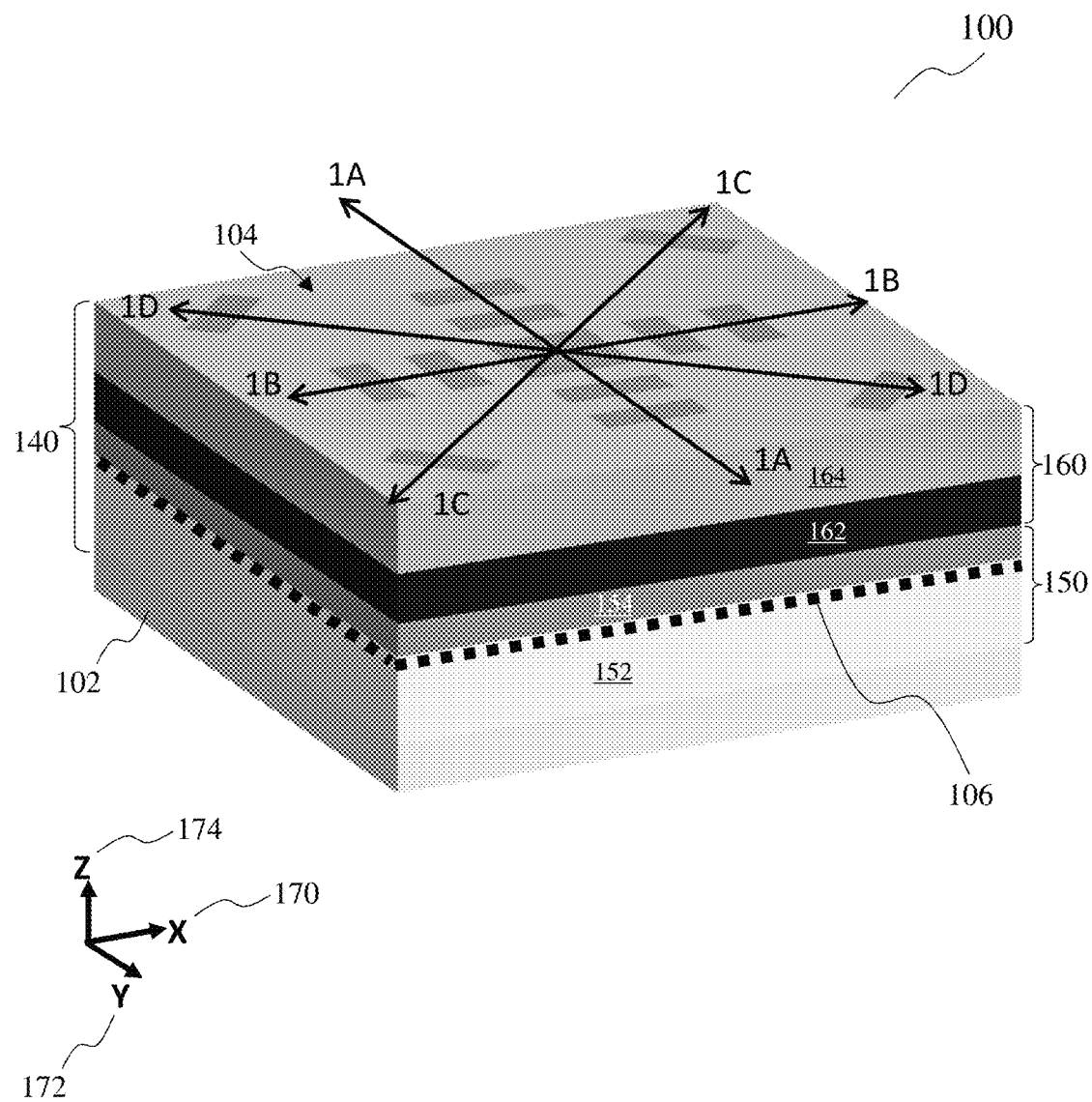
FIG. 1 shows a perspective schematic view of a magnetic field sensor according to various non-limiting embodiments.

The embodiments generally relate to magnetic field sensors. More particularly, some embodiments relate to magnetic field sensors that include Hall-effect sensors. These magnetic field sensors are capable of sensing magnetic field in three-dimensions, and are also compatible with 2DEG platforms.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a perspective schematic view of a magnetic field sensor 100 according to various non-limiting embodiments. The magnetic field sensor 100 may include a semiconductor structure 140. The semiconductor structure 102 may have a planar surface 104. In the following, the terms "horizontal" and "vertical" are used to denote the orientation of devices with respect to the planar surface 104, where "horizontal" refers to an orientation that is parallel to the planar surface 104 while "vertical" refers to an orientation that is normal to the planar surface 104. Also, in the terms "in-plane" and "out-of-plane", "plane" refers to the planar surface 104 or a plane that is parallel to the planar surface 104. The x-axis 170 and the y-axis 172 are in-plane, while the z-axis 174 is out-of-plane. The x-axis 170, the y-axis 172 and the z-axis 174 are orthogonal to one another.

The magnetic field sensor 100 may further include a substrate 102. The substrate 102 may be provided under the semiconductor structure 140 and may support the semiconductor structure 140. The semiconductor structure 140 may include a semiconductor member 150 and an insulator member 160. The semiconductor member 150 may include a first layer 152 and a second layer 154. The first layer 152 may be arranged on the substrate 102. The second layer 154 may be arranged on the first layer 152. The first layer 152 may include a first III-V compound while the second layer 154 may include a second III-V compound. Each of the first III-V compound and the second III-V compound may include a III-nitride compound, for example, gallium nitride (GaN). For example, the first layer 152 may include GaN. For example, the second layer 154 may include AlGaN. The first and second layers 152, 154 may have different bandgaps such that a 2DEG layer 106 is formed at a junction of the first and second layers 152, 154. The electron gas of the 2DEG layer 106 includes electrons that are at least substantially confined to movement in two dimensions only, but is tightly confined in the third dimension.

The insulator member 160 may be arranged on the semiconductor member 150. The insulator member 160 may include a first insulator layer 162 and a second insulator layer 164. The second insulator layer 164 may be arranged on the first insulator layer 162. The first insulator layer may include an oxide, for example aluminum oxide. The second insulator layer 164 may also include an oxide, for example, silicon dioxide.

The magnetic field sensor 100 may further include a first sensing device 110, a second sensing device 120 and a third sensing device 130 (not labelled in FIG. 1 for clarity of the figure). The first, second and third second sensing devices 110, 120, 130 will be described further with respect to FIGS. 2A, 2B, 3A to 3C, 4 and 5.

According to various non-limiting embodiments, the semiconductor structure 140 may further include a transistor, such as a high electron mobility transistor (HEMT). The first layer 152 may be a buffer layer of the transistor. The second layer 154 may be a barrier layer of the transistor. The insulator member 160 may include the dielectric layer of the transistor. The channel of the transistor may be part of the 2DEG layer 106.

Figure 2A:
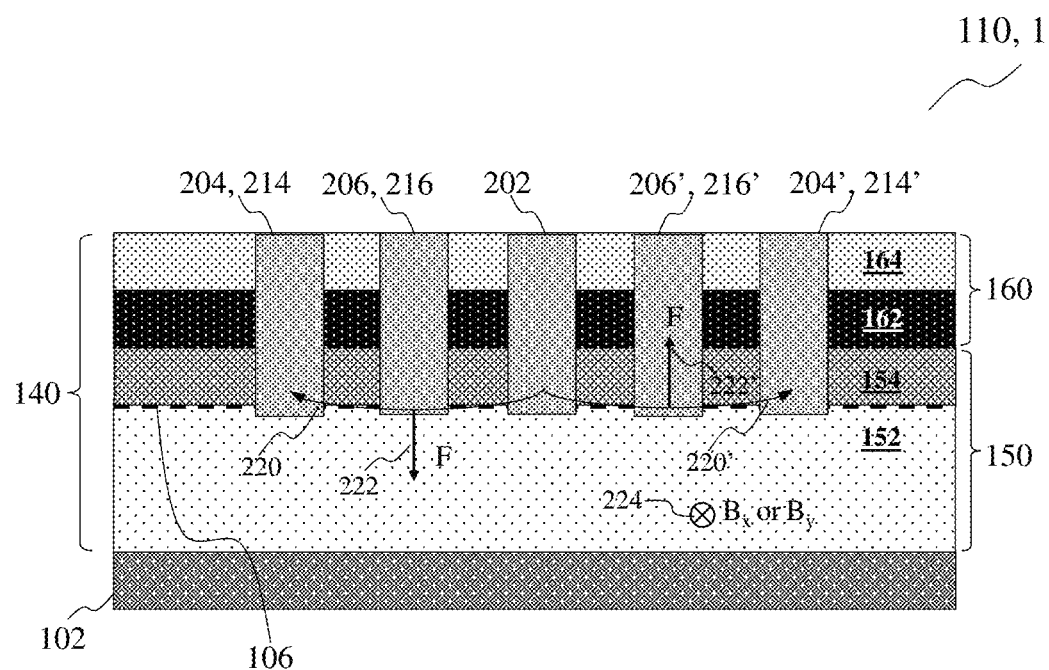
FIG. 2A shows a cross-sectional schematic view of the magnetic field sensor taken on the line 1A-1A or the line 1B-1B of FIG. 1.

FIG. 2A shows a cross-sectional schematic view of the magnetic field sensor 100 taken on the line 1A-1A or the line 1B-1B of FIG. 1. The cross-sectional view taken on the line 1A-1A shows a cross-section of the first sensing device 110 while the cross-sectional view taken on the line 1B-1B shows a cross-section of the second sensing device 120. The line 1B-1B is parallel to the x-axis 170 while the line 1A-1A is parallel to the y-axis 172. The cross-sectional views taken on the line 1A-1A and the line 1B-1B may be at least substantially similar, or identical. In other words, the first sensing device 110 and the second sensing device 120 may be at least substantially similar, but may be oriented perpendicularly to one another. As such, the description of the first sensing device 110 also applies to the second sensing device 120.

Both the first sensing device 110 and the second sensing device 120 may be formed in the semiconductor structure 140 and may each include a respective vertical Hall-effect device. The first and second sensing devices 110, 120 may be configured to detect magnetic field components parallel to the planar surface 104. The first sensing device 110 may include a first plurality of electrodes. The first plurality of electrodes may include side input electrodes 204, 204', output electrodes 206, 206', and a central input electrode 202. The first plurality of electrodes may be arranged along the line 1A-1A. The output electrodes 206, 206' may be arranged between the side input electrode 204 and the other side input electrode 204'. The central input electrode 202 may be arranged between the output electrode 206 and the other output electrode 206'. Each electrode of the first plurality of electrodes may extend from the insulator member 160 to within the semiconductor member 150. In particular, the first plurality of electrodes may extend from the second insulator layer 164 to the 2DEG layer 106, or even to the first layer 152.

When the first sensing device 110 is in operation, voltages are applied to the central input electrode 202 and the side input electrodes 204, 204' such that a potential difference is formed between the central input electrode 202 and the side input electrode 204, as well as between the central input electrode 202 and the other side input electrode 204'. The voltages applied to the two side input electrodes 204, 204' may be identical such that the potential difference between the central input electrode 202 and the side input electrode 204 is at least substantially equal to the potential difference between the central input electrode 202 and the other side input electrode 204'. An electrical current 220 flows between the central input electrode 202 and the side input electrode 204 and an electrical current 220' flows between the central input electrode 202 and the side input electrode 204, as a result of the respective potential differences. The electrical current 220 may be at least substantially identical in magnitude as the electrical current 220', but these two electrical currents may be opposite in directions. When there are magnetic field components 224 along the x-axis 170, forces 222 and 224 are generated. These forces 222, 224 deflect electrons or charge carriers in the 2DEG layer 106, thereby generating changes in voltage at the output electrodes 206, 206' of the first sensing device 110. The voltage, i.e. potential difference, between the output electrodes 206, 206' of the first sensing device 110 may be indicative of the magnetic field strength along the x-axis 170. The voltage between the output electrodes 206, 206' of the first sensing device 110 may be proportional to the magnetic field strength along the x-axis 170.

The second sensing device 120 may also include a second plurality of electrodes. Similar to the first plurality of electrodes, the second plurality of electrodes may also include side input electrodes 214, 214', output electrodes 216, 216', and a central input electrode 202. The second plurality of electrodes may be arranged along the line 1B-1B. The second sensing device 120 may share a common central input electrode 202 with the first sensing device 110. In other words, the same central input electrode 202 may be used to provide an input voltage to both the first sensing device 110 and the second sensing device 120. The first plurality of electrodes may intersect the second plurality of electrodes, at the central input electrode 202. In alternative embodiments, the first and second sensing devices 110, 120 may have separate central input electrodes 202.

Like the first sensing device 110, when the second sensing device 120 is in operation, voltages are applied to the side input electrodes 214, 214' and the central input electrode 202. When there are magnetic field components 224 along the y-axis 172, forces 222 and 224 are generated. These forces 222, 224 deflect electrons or charge carriers in the 2DEG layer 106, thereby generating changes in voltage at the output electrodes 216, 216' of the second sensing device 120. The voltage between the output electrodes 216, 216' of the second sensing device 120 may be indicative of the magnetic field strength along the y-axis 172. The voltage between the output electrodes 216, 216' of the second sensing device 120 may be proportional to the magnetic field strength along the y-axis 172.

Figure 2B:
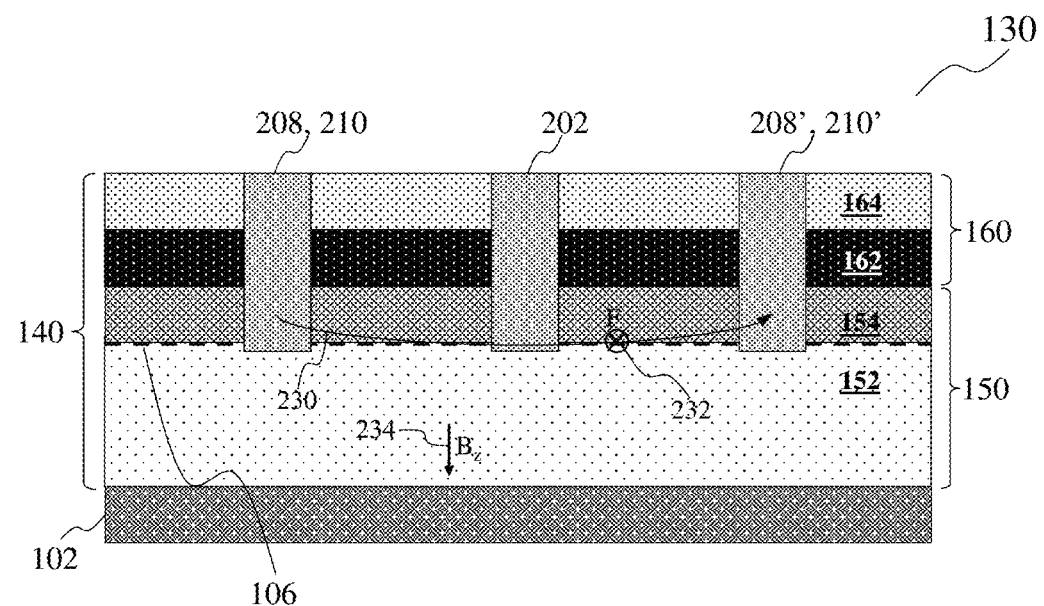
FIG. 2B shows a cross-sectional schematic view of the magnetic field sensor taken on the line 1C-1C or the line 1D-1D of FIG. 1.

FIG. 2B shows a cross-sectional schematic view of the magnetic field sensor 100 taken on the line 1C-1C or the line 1D-1D of FIG. 1. The line 1D-1D is perpendicular to the line 1C-1C and intersects the line 1C-1C. The cross-sectional view taken on the line 1C-1C shows a cross-section of a first half of the third sensing device 130 while the cross-sectional view taken on the line 1D-1D shows a cross-section of a second half of the third sensing device 130. The cross-sectional views taken on the line 1C-1C and the line 1D-1D may be at least substantially similar, or identical. In other words, the first half of the third sensing device 130 and the second half of the third sensing device 130 may be at least substantially similar, but may be oriented perpendicularly to one another. The line 1C-1C may be 45 degrees relative to each of the x-axis 170 and the y-axis 172. The line 1C-1C may intersect the first plurality of electrodes, as well as the second plurality of electrodes. The line 1C-1C may also bisect the first plurality of electrodes, as well as the second plurality of electrodes, such that the central input electrode 202 is visible in the cross-sectional views taken on the lines 1C-1C or 1D-1D. The arrangement of the first half and the second half of the third sensing device 130 may be interchangeable.

The third sensing device 130 may be configured to detect magnetic field components that are orthogonal, i.e. normal, to the planar surface 104. The third sensing device 130 may include a third plurality of electrodes. The third plurality of electrodes may include a pair of input electrodes 208, 208' arranged along the line 1C-1C and a pair of output electrodes 210, 210' arranged along the line 1D-1D. An imaginary input line may connect the input electrode 208 to the input electrode 208' while an imaginary output line may connect the output electrode 210 to the output electrode 210'. The input line may be orthogonal to the output line. The output line may intersect the input line. The input electrodes 208 and 208' may be arranged equidistant from the second direction, while the output electrodes 210 and 210' may be arranged equidistant from the first direction.

The input electrodes 208, 208' may be arranged on opposite sides of the central input electrode 202. Similarly, the output electrodes 210, 210' may be arranged on opposite sides of the central input electrode 202. Like the first and second plurality of electrodes, each electrode of the third plurality of electrodes may extend from the insulator member 160 to within the semiconductor member 150. In particular, the third plurality of electrodes may extend from the second insulator layer 164 to the 2DEG layer 106, or even to the first layer 152.

When the third sensing device 130 is in operation, a potential difference is applied between the input electrodes 208, 208'. An electrical current 230 flows from the input electrode 208 to the other input electrode 208', as a result of the potential difference. When there are magnetic field components 234 along the z-axis 174, force 232 is generated. The force 232 deflect electrons or charge carriers in the 2DEG layer 106, thereby generating changes in voltage at the output electrodes 210, 210'. The voltage between the output electrodes 210, 210' may be indicative of the magnetic field strength along the z-axis 174. The voltage between the output electrodes 210, 210' may be proportional to the magnetic field strength along the z-axis 174.

Figure 3A:
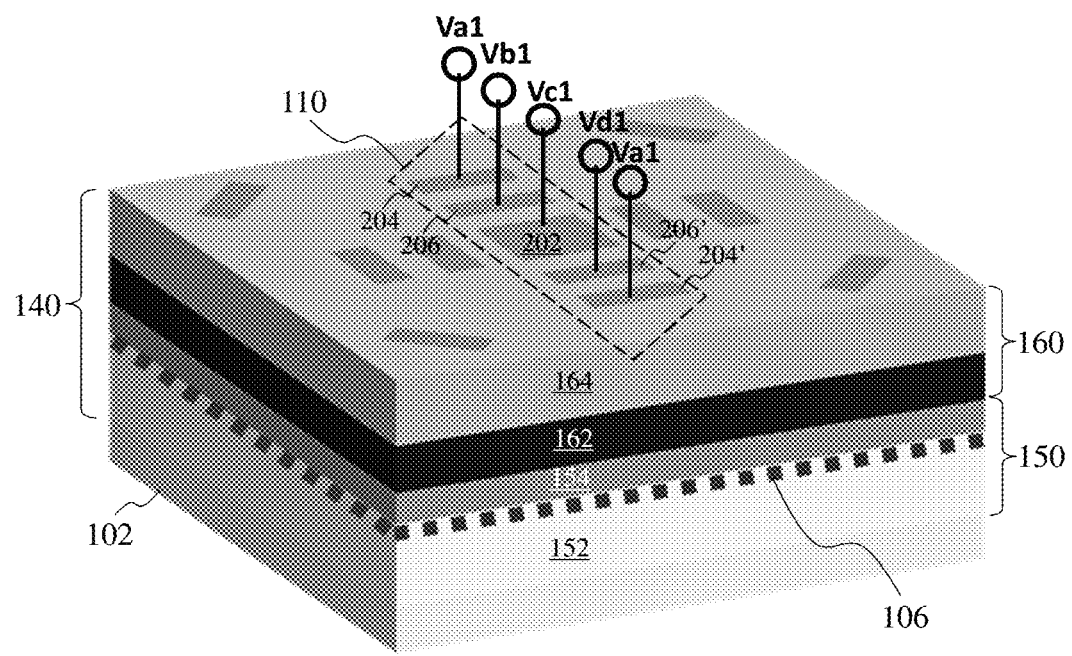
FIGS. 3A to 3C show perspective schematic views of the first, second and third sensing devices of the magnetic field sensor, respectively.
Figure 3B:
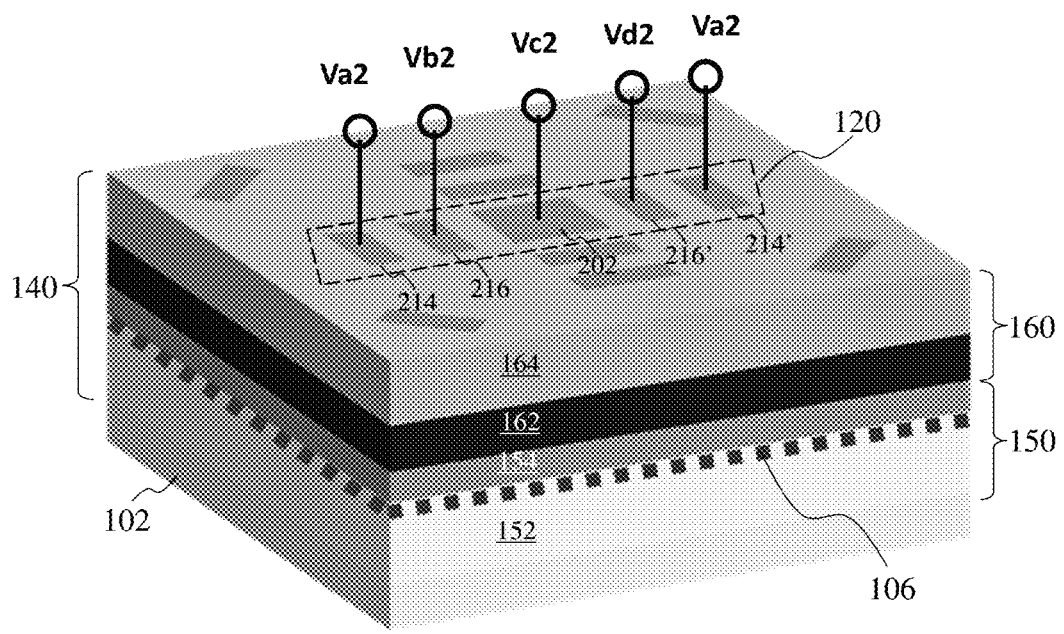
Figure 3C:
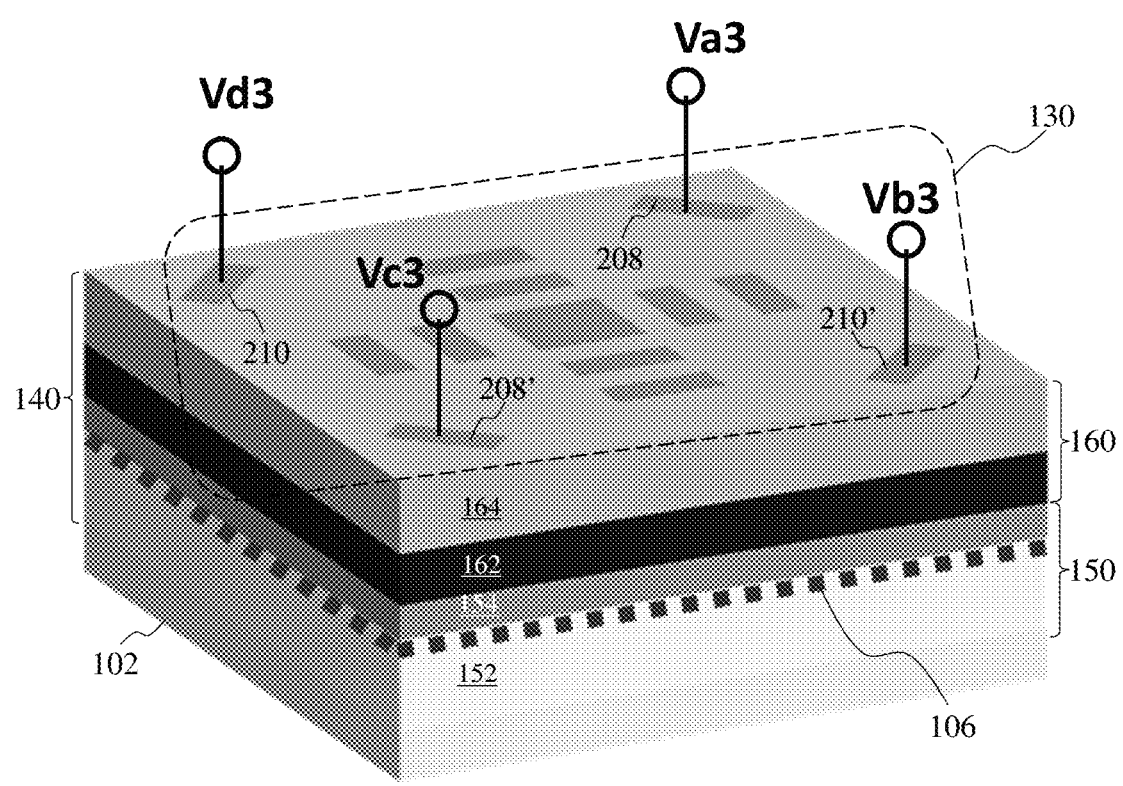

FIGS. 3A to 3C show perspective schematic views of the first, second and third sensing devices 110, 120 and 130 of the magnetic field sensor 100, respectively. Some reference numerals are omitted in these figures for clarity.

Referring to FIG. 3A, when the first sensing device 110 is in operation, a voltage $V_{c1}$ may be applied to the central input electrode 202 and a voltage $V_{a1}$ may be applied to each of the side input electrodes 204, 204'. The input voltage, $V_{in1}$ may be the potential difference across the central input electrode 202 and each of the side input electrodes 204, 204'. In other words, $v_{in1} = V_{a1} - V_{c1}$. As described with respect to FIG. 2A, the input voltage causes electrical currents to run between the central input electrode 202 and the side input electrodes 204, 204' in two opposite directions. Alternatively, instead of an input voltage, input electrical currents may be provided to the first sensing device 110. The input currents may be injected, or forced into the first sensing device 110, through the central input electrode 202 or the side input electrodes 204, 204'. The interaction between the electrical currents and an in-plane magnetic field in the x-axis 170 produces a magnetic force in the semiconductor structure 140 that acts on the charge carriers in the 2DEG layer 106. Consequently, electrical current flows between the output electrodes 206, 206' and voltages $V_{b1}$ and $V_{d1}$ are measured at the output electrodes 206 and 206' respectively. The output voltage of the first sensing device 110, also referred herein as the Hall voltage, $V_{H1}$, may be the potential difference between the output electrodes 206 and 206' of the first sensing device 110. In other words, $V_{H1} = V_{b1} - V_{d1}$.

Referring to FIG. 3B, the second sensing device 120 may operate similarly to the first sensing device 110. A voltage $V_{a2}$ may be applied to the central input electrode 202 and a second input voltage $V_a t$ may be applied to each of the side input electrodes 214, 214' such that the potential difference $V_{in2}$ across the central input electrode 202 and each of the side input electrodes 214, 214' is $V_{a2} - V_{c2}$. The input voltage causes electrical currents to run between the central input electrode 202 and the side input electrodes 214, 214' in two opposite directions. Alternatively, instead of an input voltage, input electrical currents may be injected, or forced into the second sensing device 120, through the central input electrode 202 or the side input electrodes 214, 214'. The interaction between the electrical currents and an in-plane magnetic field in the y-axis 172 produces a magnetic force in the semiconductor structure 140 that acts on the charge carriers in the 2DEG layer 106. As a result, a current is induced between the output electrodes 216, 216' and voltages $V_{b2}$ and $V_{d2}$ are measured at the output electrodes 216 and 216' respectively. The Hall voltage, $V_{H2}$, of the second sensing device 120 may be the potential difference between the output electrodes 216 and 216'. In other words, $V_{H2} = V_{b2} - V_{d2}$.

Referring to FIG. 3C, when the third sensing device 130 is in operation, a voltage $V_{a3}$ may be applied to the input electrode 208 and a voltage $V_{c3}$ may be applied to the other input electrode 208'. The input voltage of the third sensing device 130, $V_{in3}$ may be the potential difference across the input electrodes 208, 208'. In other words, $V_{in3} = V_{a3} - V_{c3}$. As described with respect to FIG. 2B, the input voltage causes an electrical current to run between the input electrodes 208, 208'. Alternatively, instead of applying the input voltage, the electrical current may be injected, or forced into the third sensing device 110, through one of the input electrodes 208, 208'. The interaction between the electrical current and an out-of-plane magnetic field in the z-axis 174 produces a magnetic force in the semiconductor structure 140 that acts on the charge carriers in the 2DEG layer 106. Consequently, electrical current flows between the output electrodes 210, 210' and voltages $V_{b3}$ and $V_{a3}$ are measured at the output electrodes 210' and 210, respectively. The Hall voltage of the third sensing device 130, $V_{H3}$, may be the potential difference between the output electrodes 210 and 210'. In other words, $V_{H3} = V_{b3} - V_{d3}$.

The magnetic field sensor 100 may be superior in performance, as compared to a silicon-based Hall-effect sensor. For example, the electron mobility of the magnetic field sensor 100 at room temperature may be in a range of about 1500 to about 2000 cm$^2$/V·s, while the electron mobility of a silicon-based Hall-effect sensor is typically about 1200 cm$^2$/V·s. The high electron mobility of the magnetic field sensor 100 may allow it to achieve high sensitivity and a low offset error. In addition, the magnetic field sensor 100 may be thermally stable up to about 800° C. Further, the magnetic field sensor 100 is compatible with existing GaN or 2DEG fabrication processes and as such, incurs a low marginal fabrication cost when it is fabricated together with other GaN or 2DEG devices.

Figure 4:
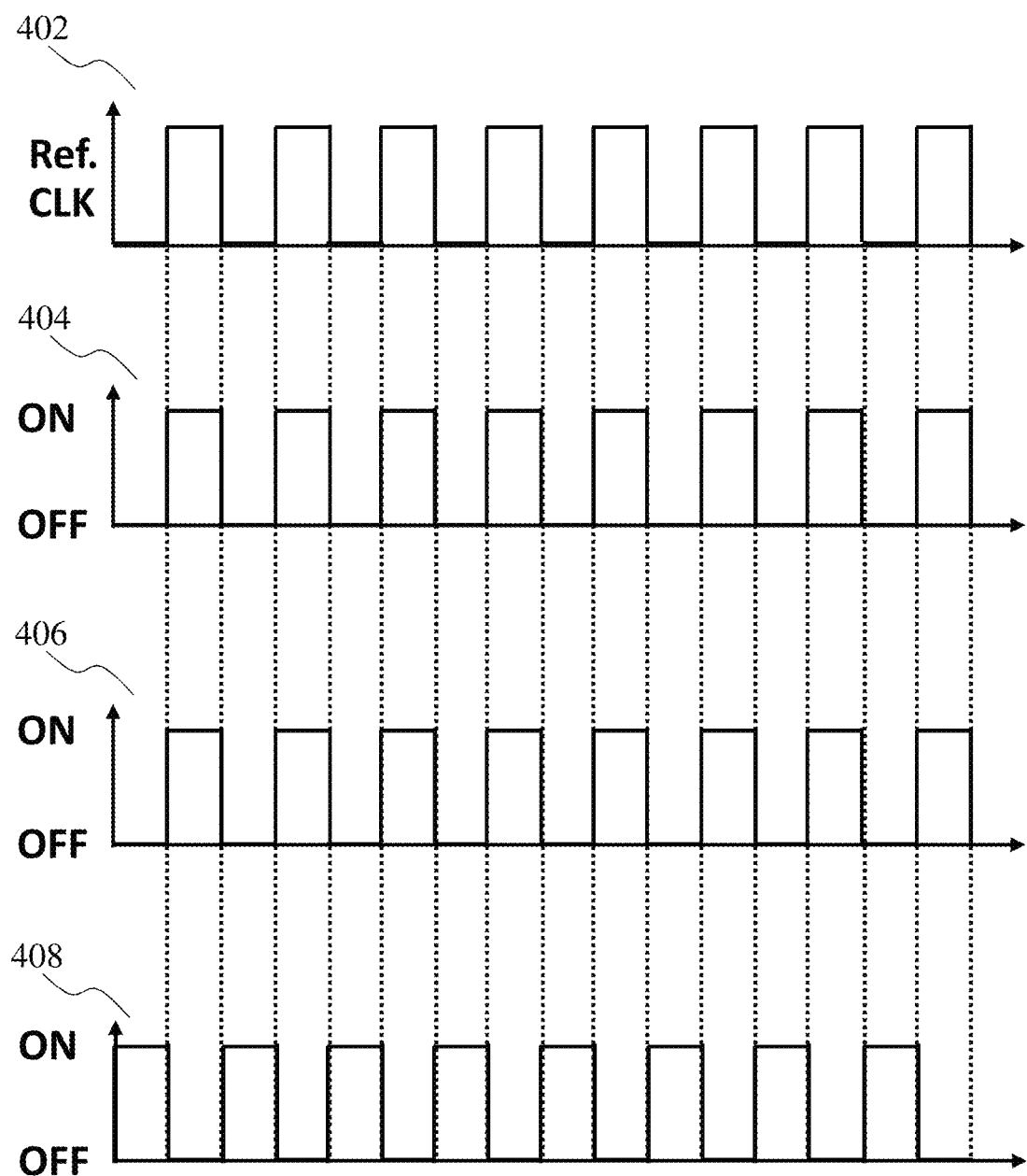
FIG. 4 shows timing diagrams of the magnetic field sensor operating in a first operating mode, according to various non-limiting embodiments.

FIG. 4 shows timing diagrams of the magnetic field sensor 100 operating in a first operating mode, according to various non-limiting embodiments. FIG. 4 includes a timing diagram 402 of the reference clock, a timing diagram 404 of the first sensing device 110, a timing diagram 406 of the second sensing device 120, and a timing diagram 408 of the third sensing device 130. In the first operating mode, the first and second sensing devices 110, 120 may operate concurrently. As shown in the timing diagrams 404 and 406, the first and second sensing devices 110, 120 may switch on and off at the same time. In other words, their operation cycles may coincide. During the ON duration of the sensing devices, input voltage $V_{in1}$ may be applied across the central input electrode 202 and each of the side input electrodes 204, 204' of the first sensing device 110, and input voltage and $V_{in2}$ may be applied across the central input electrode 202 and each of the side input electrodes 214, 214 of the second sensing device 120. $V_{in1}$ and $V_{in2}$ may be at least substantially identical in magnitude. The third sensing device 130 may operate at the same frequency as the first and second sensing devices 110, 120. The operating cycle of the third sensing device 130 may be offset from the duty cycles of the first and second sensing devices 110, 120. In other words, the third sensing device 130 may switch ON operate when the first and second sensing devices 110, 120 are OFF. In other words, the third sensing device 130 may operate alternately with each of the first and second sensing devices 110, 120. Each of the first, second and third sensing devices 110, 120, 130 may operate at the same frequency as the reference clock. Each of the first, second and third sensing devices 110, 120, 130 may operate at 50% duty cycle.

Figure 5:
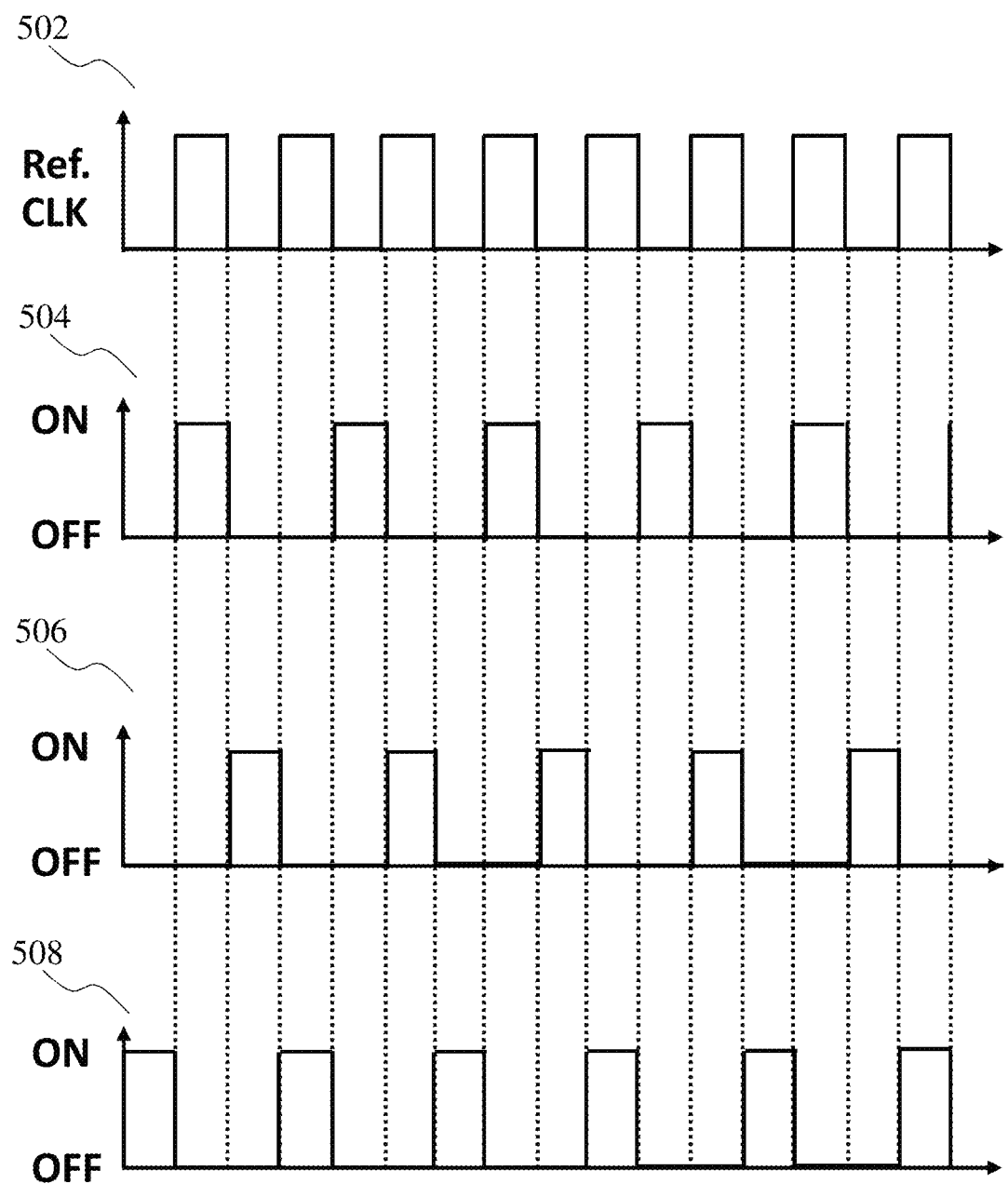
FIG. 5 shows timing diagrams of the magnetic field sensor operating in a second operating mode, according to various non-limiting embodiments.

FIG. 5 shows timing diagrams of the magnetic field sensor 100 operating in a second operating mode, according to various non-limiting embodiments. FIG. 5 includes a timing diagram 502 of the reference clock, a timing diagram 504 of the first sensing device 110, a timing diagram 506 of the second sensing device 120, and a timing diagram 508 of the third sensing device 130. The second operating mode may differ from the first operating mode, in that operations of the first, second and third sensing devices 110, 120, 130 may be offset relative to one another. In other words, at any one time, only one sensing device may be operating. The first, second and third sensing devices 110, 120, 130 may operate sequentially instead of concurrently. The duty cycle of each of the first, second and third sensing devices 110, 120, 130 may be one-third.

Figure 6A:
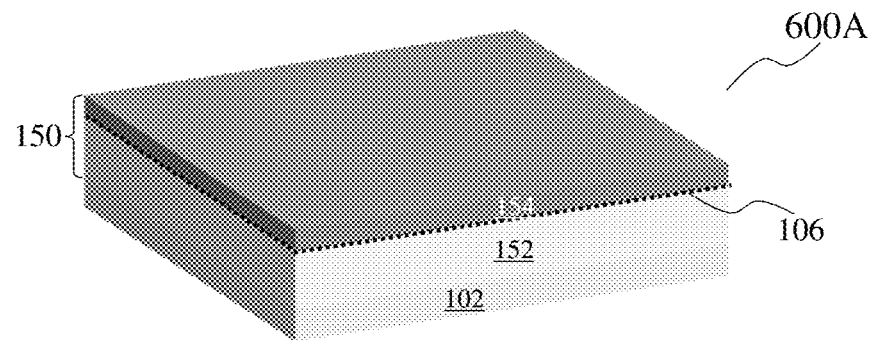
FIGS. 6A to 6C show perspective schematic views that illustrate a method of fabricating the magnetic field sensor, according to various non-limiting embodiments.
Figure 6B:
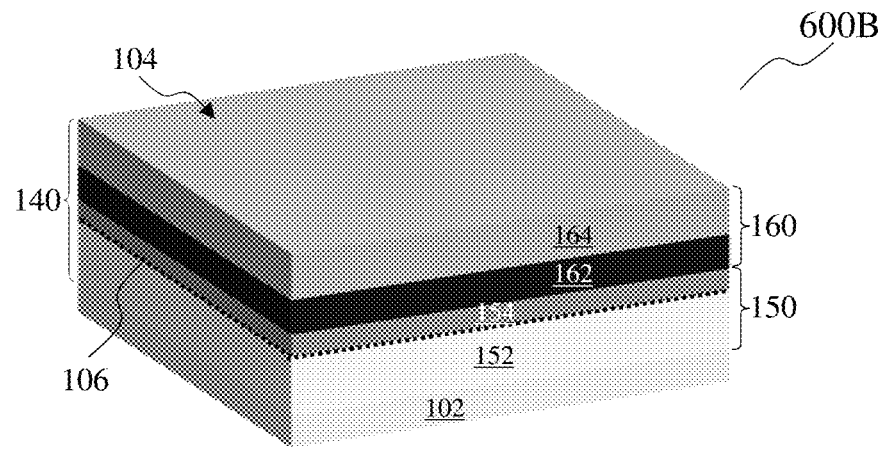
Figure 6C:
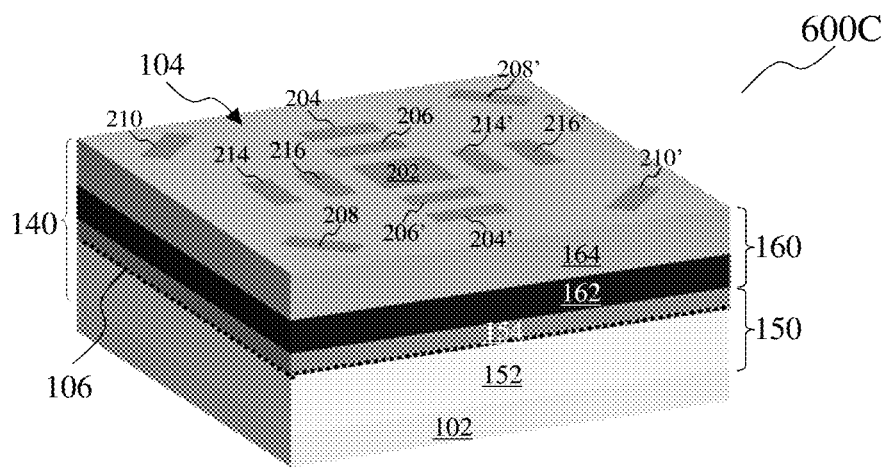
Figure 7A:
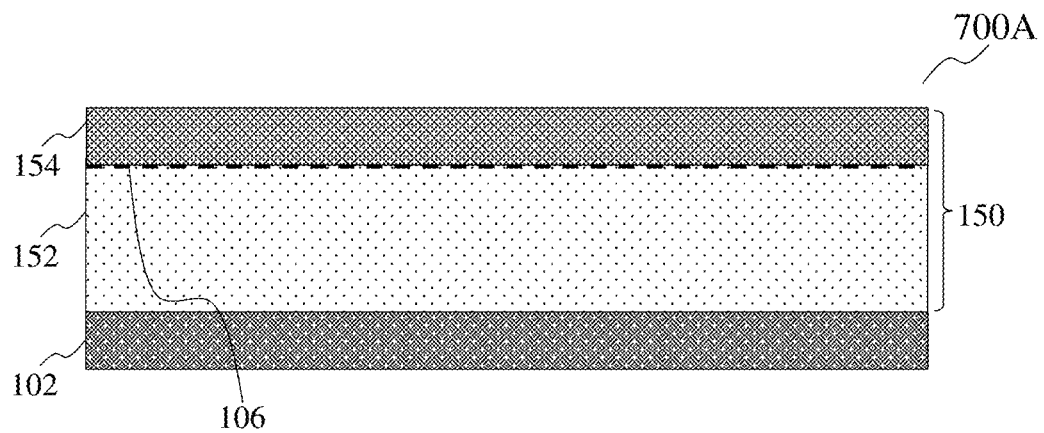
FIGS. 7A, 7B and 7C show cross-sectional schematic views taken on the line 1B-1B that correspond to FIGS. 6A, 6B and 6C, respectively.
Figure 7B:
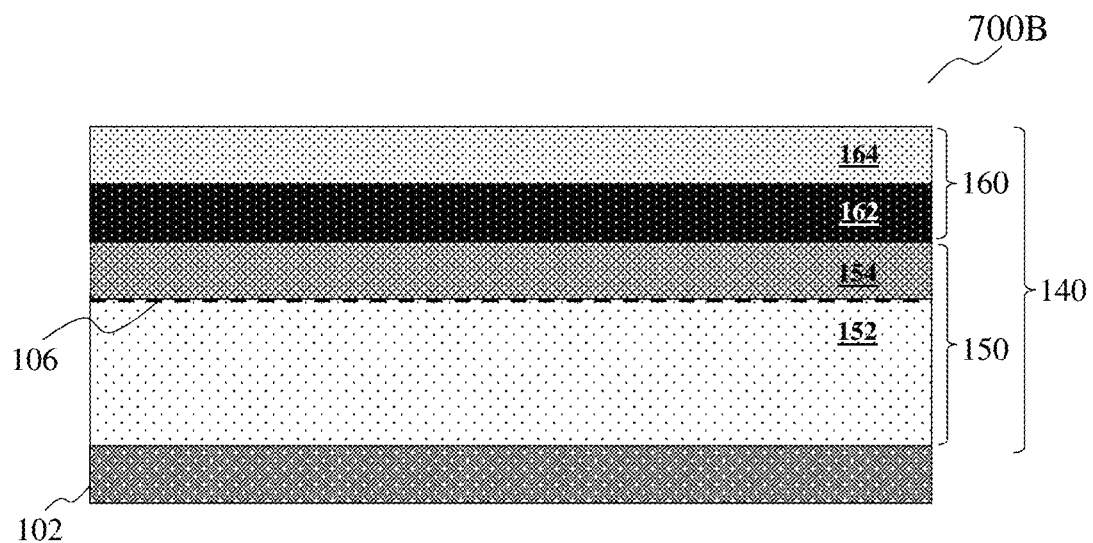
Figure 7C:
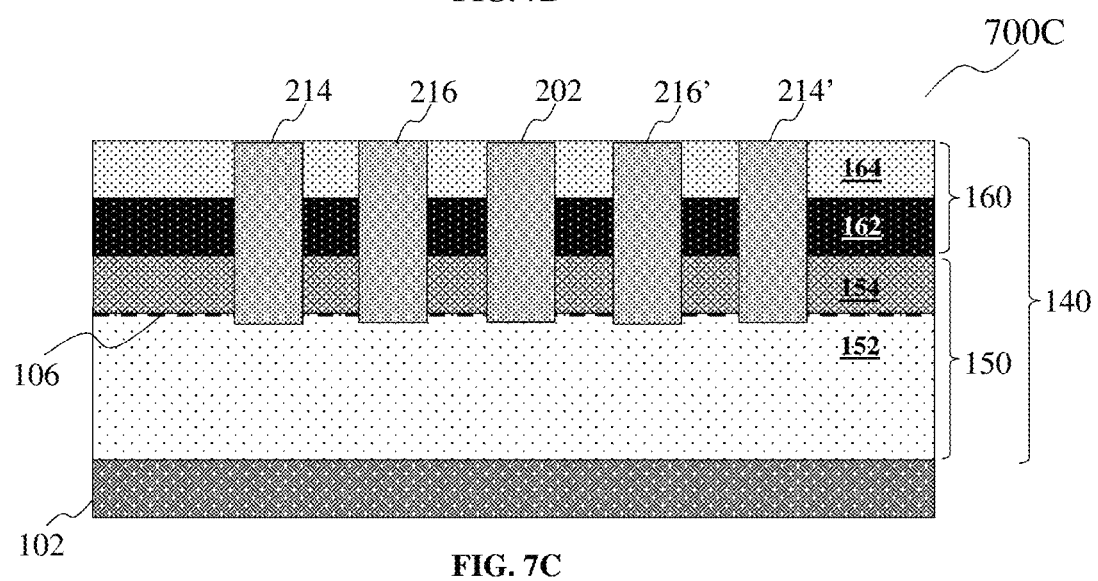

FIGS. 6A to 6C show perspective schematic views that illustrate a method of fabricating the magnetic field sensor 100, according to various non-limiting embodiments. FIGS. 7A, 7B and 7C show cross-sectional schematic views taken on the line 1B-1B that correspond to FIGS. 6A, 6B and 6C, respectively.

Referring to FIGS. 6A and 7A, the method may include a process 600A. The process 600A may include forming the semiconductor member 150. The process 600A may include disposing a first III-V compound on a substrate 102 to form a first layer 152. The process 600A may further include disposing a second III-V compound over the first layer 152 to form a second layer 154. The first and second III-V compounds may have dissimilar band gaps, such that they form a heterojunction between the first and second layers 152, 154. Electrons may accumulate at the interface between the first layer 152 and the second layer 154, thereby forming the 2DEG layer 106.

Referring to FIGS. 6B and 7B, the method may include a process 600B. The process 600B may include forming the insulator member 160 on the semiconductor member 150. The process 600B may include disposing a first insulator material on the semiconductor member 150 to form a first insulator layer 162. The process 600B may further include disposing a second insulator material on the first insulator layer 162 to form a second insulator layer 164. The resulting device may be referred herein as the semiconductor structure 140.

Referring to FIGS. 6C and 7C, the method may include a process 600C. The process 600C may include forming the first sensing device 110, the second sensing device 120 and the third sensing device 130 in the semiconductor structure 140. The process 600C may include forming the first plurality of electrodes which includes a central input electrode 202, two side input electrodes 204, 204' and two output electrodes 206, 206'. The process 600C may further include forming the second plurality of electrodes, which like the first plurality of electrodes, also includes a central input electrode 202, two side input electrodes 204, 204' and two output electrodes 206, 206'. The process 600C may further include forming the third plurality of electrodes which includes two input electrodes 208, 208 and two output electrodes 210, 210'. In other words, the process 600C may include forming all the electrodes of the first, second and third sensing devices 110, 120, 130. The process 600C may include forming cavities in the semiconductor structure 140, for example, by etching. The cavities may be formed through the insulator member 160 and the second layer 154, to reach the first layer 152. The process 600C may include depositing a conductive material into the cavities, to form the electrodes. All the cavities formed in the semiconductor structure 140 may have the same depth and therefore, all of the electrodes of the first, second and third sensing devices 110, 120, 130 may be at least substantially identical in height. Also, as all the electrodes may be formed from the same deposited conductive material, all of the electrodes may be identical in material composition.

In alternative embodiments, the first plurality of electrodes, the second plurality of electrodes and the third plurality of electrodes may not have the same height. In alternative embodiments, the first plurality of electrodes, the second plurality of electrodes and the third plurality of electrodes may have different material compositions.

Following the process 600C, conventional back end of line (BEOL) processes may be carried out to form interconnects, for example between the magnetic field sensor and other devices.

Figure 8:
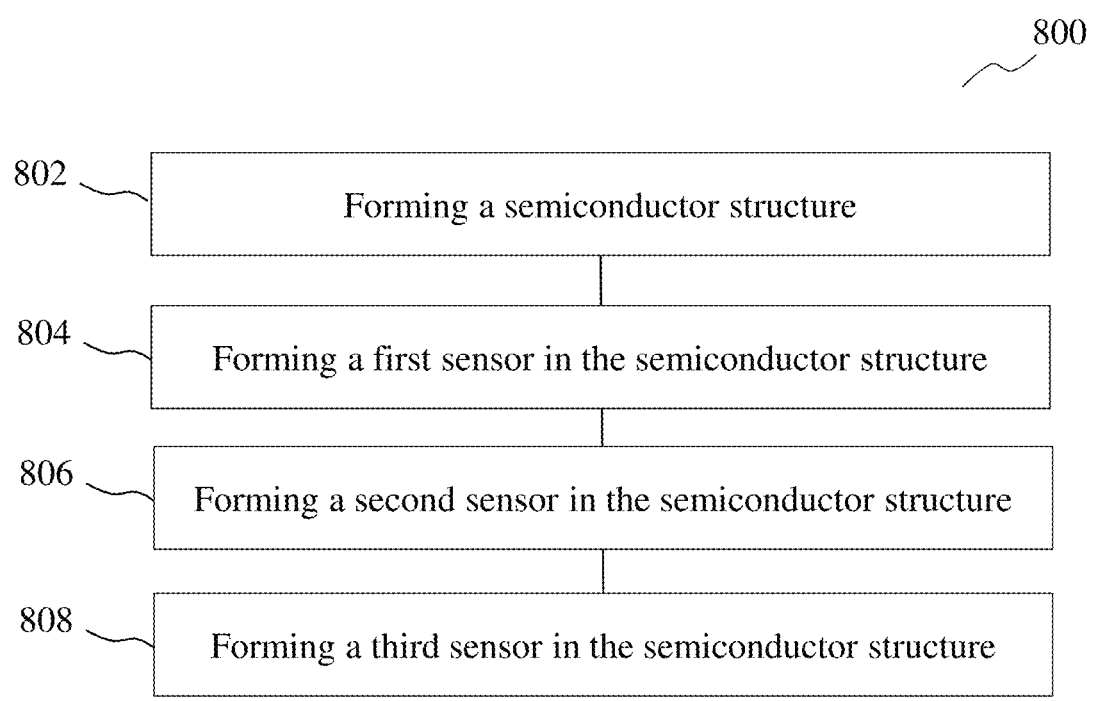
FIG. 8 shows a flow diagram of a method for fabricating a magnetic field sensor according to various non-limiting embodiments.

FIG. 8 shows a flow diagram 800 of a method for fabricating a magnetic field sensor 100, according to various non-limiting embodiments. The method may include forming a semiconductor structure 140 in 802. 802 may include the processes 600A and 600B described with respect to FIGS. 6A, 6B, 7A and 7B. The semiconductor structure 140 may have a planar surface 104. The semiconductor structure 140 may include a semiconductor member 150 having a 2DEG 106 layer. The semiconductor structure 140 may include an insulator member 160 and a semiconductor member 150 under the insulator member 160.

The method may further include forming a first sensing device 110 in the semiconductor structure 140 in 804. The first sensing device 110 may include a first plurality of electrodes and may be configured to sense magnetic field along a first axis parallel to the planar surface 104.

The method may further include forming a second sensing device 120 in the semiconductor structure 140, in 806. The second sensing device 120 may include a second plurality of electrodes and may be configured to sense magnetic field along a second axis parallel to the planar surface 104. The second axis may be perpendicular to the first axis. The method may further include forming a third sensing device 130 in the semiconductor structure 140, in 708. The third sensing device 130 may include a third plurality of electrodes and may be configured to sense magnetic field along a third axis. The third axis may be normal to the planar surface 104. All electrodes of the first plurality of electrodes, the second plurality of electrodes and the third plurality of electrodes may extend from the insulator member 160 to the 2DEG layer 106. Each of 804, 806, and 808 may be part of the process 600C described with respect to FIGS. 6C and 7C. Each of the first sensing device 110, the second sensing device 120, and the third sensing device 130 may be patterned and etched simultaneously.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A magnetic field sensor comprising:
   a semiconductor structure having a planar surface, wherein the semiconductor structure comprises a semiconductor member having a two-dimensional electron gas layer therein, and further comprises an insulator member disposed on the semiconductor member;
   a first sensing device formed in the semiconductor structure, wherein the first sensing device comprises a first plurality of electrodes, and wherein the first sensing device is configured to sense a magnetic field along a first axis parallel to the planar surface;
   a second sensing device formed in the semiconductor structure, wherein the second sensing device comprises a second plurality of electrodes, and wherein the second sensing device is configured to sense a magnetic field along a second axis parallel to the planar surface, the second axis being orthogonal to the first axis; and a third sensing device formed in the semiconductor structure, wherein the third sensing device comprises a third plurality of electrodes, and wherein the third sensing device is configured to sense magnetic field along a third axis normal to the planar surface,
wherein all electrodes of the first plurality of electrodes, the second plurality of electrodes and the third plurality of electrodes, extend from the insulator member to the two-dimensional electron gas layer.

2. The magnetic field sensor of claim 1, wherein the first plurality of electrodes, the second plurality of electrodes, and the third plurality of electrodes are identical in height and/or material composition.

3. The magnetic field sensor of claim 1, wherein at least one of the first sensing device and the second sensing device is a vertical Hall-effect sensor.

4. The magnetic field sensor of claim 1, wherein the first plurality of electrodes are arranged in a line parallel to the second axis, and wherein the second plurality of electrodes are arranged in a line parallel to the first axis,
wherein each of the first plurality of electrodes and the second plurality of electrodes comprises:
two side input electrodes;
two output electrodes arranged between the two side input electrodes; and
a central input electrode arranged between the two output electrodes.

5. The magnetic field sensor of claim 4, wherein the first sensing device and the second sensing device comprise the same central input electrode.

6. The magnetic field sensor of claim 4, wherein each electrode of the first plurality of electrodes, the second plurality of electrodes and the third plurality of electrodes comprises a top surface co-planar with a top surface of the insulator member.

7. The magnetic field sensor of claim 6, wherein the semiconductor member comprises a first layer and a second layer on the first layer,
wherein each electrode of the first plurality of electrodes, the second plurality of electrodes and the third plurality of electrodes comprises side surfaces surrounded by the insulator member and by the second layer of the semiconductor member,
wherein each electrode of the first plurality of electrodes, the second plurality of electrodes and the third plurality of electrodes comprises a bottom surface directly contacting the first layer of the semiconductor member, and
wherein a junction between the first layer and the second layer of the semiconductor member comprises the two-dimensional electron gas layer.

8. The magnetic field sensor of claim 7, wherein the insulator member comprises a first insulator layer and a second insulator layer on the first insulator layer,
wherein a top surface of the second insulator layer comprises the top surface of the insulator member,
wherein the side surfaces of each electrode of the first plurality of electrodes, the second plurality of electrodes and the third plurality of electrodes are surrounded by the first insulator layer and the second insulator layer.

9. The magnetic field sensor of claim 1, wherein the semiconductor member comprises:
a first layer comprising a III-V compound; and
a second layer on the first layer, the second layer comprising a further III-V compound,
wherein a junction between the first layer and the second layer comprises the two-dimensional electron gas layer.

10. The magnetic field sensor of claim 9, wherein the III-V compound is GaN, and wherein the further III-V compound is AlGaN.

11. The magnetic field sensor of claim 1, wherein the insulator member comprises:
a first insulator layer; and
a second insulator layer on the first insulator layer, wherein the second insulator layer is different from the first insulator layer.

12. The magnetic field sensor of claim 11, wherein the first insulator comprises aluminium oxide and/or the second insulator comprises silicon dioxide.

13. The magnetic field sensor of claim 5, wherein the third plurality of electrodes comprises:
two input electrodes, wherein the two input electrodes and the same central input electrode are arranged in a first diagonal line; and
two output electrodes, wherein the two output electrodes and the same central input electrode are arranged in a second diagonal line, wherein the first diagonal line is orthogonal to the second diagonal line,
each of the first diagonal line and the second diagonal line are diagonals relative to the first axis and the second axis.

14. The magnetic field sensor of claim 13, wherein the two input electrodes are arranged equidistant from the second diagonal line, and wherein the two output electrodes are arranged equidistant from the first diagonal line.

15. The magnetic field sensor of claim 13, wherein the first diagonal line is 45 degrees relative to each of the first axis and the second axis.

16. A method of fabricating a magnetic field sensor, the method comprising:
forming a semiconductor structure having a planar surface, wherein the semiconductor structure comprises a semiconductor member having a two-dimensional electron gas layer therein and further comprises an insulator member disposed on the semiconductor member;
forming a first sensing device in the semiconductor structure, wherein the first sensing device comprises a first plurality of electrodes, and wherein the first sensing device is configured to sense a magnetic field along a first axis parallel to the planar surface;
forming a second sensing device in the semiconductor structure, wherein the second sensing device comprises a second plurality of electrodes, and wherein the second sensing device is configured to sense a magnetic field along a second axis parallel to the planar surface, the second axis being orthogonal to the first axis; and
forming a third sensing device in the semiconductor structure, wherein the third sensing device comprises a third plurality of electrodes, and wherein the third sensing device is configured to sense a magnetic field along a third axis normal to the planar surface;
wherein the first plurality of electrodes, the second plurality of electrodes, and the third plurality of electrodes extend from the insulator member to the two-dimensional electron gas layer.

17. The method of claim 16, wherein forming each of the first sensing device, the second sensing device, and the third sensing device comprises:
forming cavities in the semiconductor structure; and
depositing a conductive material into the cavities to form the first plurality of electrodes, the second plurality of electrodes, and the third plurality of electrodes.

18. The method of claim 16, wherein forming the semiconductor structure comprises:

forming the semiconductor member; and
forming the insulator member on the semiconductor member.

19. The method of claim 18, wherein forming the semiconductor member comprises:
disposing a III-V compound on a substrate; and
disposing another III-V compound on the III-V compound.

20. The method of claim 18, wherein forming the insulator member comprises:
disposing a first insulator material on the semiconductor member; and
disposing a second insulator material on the first insulator material.

* * * * *